(12) United States Patent
Yao

(10) Patent No.: US 6,235,650 B1
(45) Date of Patent: May 22, 2001

(54) METHOD FOR IMPROVED SEMICONDUCTOR DEVICE RELIABILITY

(75) Inventor: Liang-Gi Yao, Taipei (TW)

(73) Assignee: Vanguard International Semiconductor Corporation, Hsin-chu (TW)

( * ) Notice: Subject to any disclaimer, the term of this patent is extended or adjusted under 35 U.S.C. 154(b) by 0 days.

(21) Appl. No.: 08/999,204

(22) Filed: Dec. 29, 1997

(51) Int. Cl.[7] ................................................. H01L 21/31
(52) U.S. Cl. ........................... 438/786; 438/758; 438/761; 438/763; 438/778; 438/787; 438/792
(58) Field of Search ..................... 438/758, 761, 438/763, 778, 787, 792

(56) References Cited

U.S. PATENT DOCUMENTS

| | | | |
|---|---|---|---|
| 4,381,595 | 5/1983 | Denda et al. | 29/589 |
| 4,907,064 | * 3/1990 | Yamazaki et al. | 357/54 |
| 5,071,790 | 12/1991 | Kim | 437/195 |
| 5,164,339 | * 11/1992 | Gimpelson | 437/235 |
| 5,362,686 | 11/1994 | Harada | 437/238 |
| 5,508,067 | * 4/1996 | Sato et al. | 427/579 |
| 5,591,494 | * 1/1997 | Sato et al. | 427/579 |
| 5,605,599 | * 2/1997 | Benzing et al. | 156/643.1 |
| 5,928,732 | * 7/1999 | Law et al. | 427/579 |
| 5,952,723 | * 9/1999 | Takeyasu et al. | 257/771 |
| 5,976,991 | * 11/1999 | Laxman et al. | 438/786 |

OTHER PUBLICATIONS

Wolf et al., Silicon Processing for the VLSI Era, vol. 1—Process Technology, Lattice Press, p. 161, 1986.*

* cited by examiner

*Primary Examiner*—Matthew Smith
*Assistant Examiner*—Belur V Keshavan
(74) *Attorney, Agent, or Firm*—George O. Saile; Stephen B. Ackerman; Stephen G. Stanton

(57) ABSTRACT

A process of plasma-enhanced chemical vapor deposition of silicon oxynitride from a gas mixture of nitrous oxide and a silicon-containing gas employs a dual-power source of plasma generation and sustenance, to produce optimum properties of the deposited layer, for the purposes of passivation of the semiconductor surface, minimization of trapped energetic electrons, and protection of the integrated circuit device from moisture and other potentially deleterious effects.

7 Claims, 2 Drawing Sheets

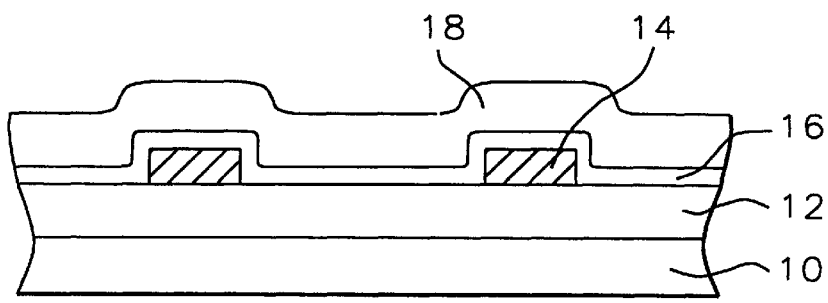
*FIG. 1 - Prior Art*
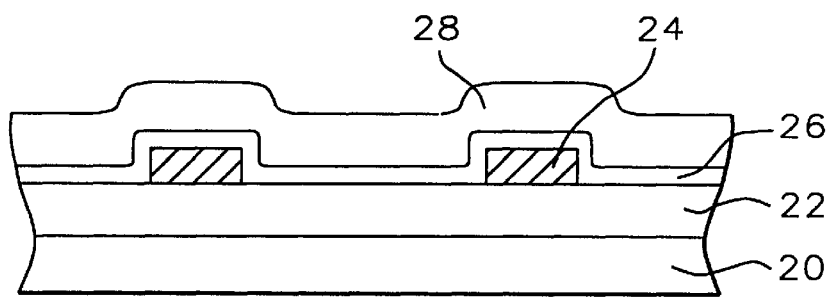
*FIG. 2*

METHOD FOR IMPROVED SEMICONDUCTOR DEVICE RELIABILITY

BACKGROUND OF THE INVENTION

(1) Field of the Invention

This invention relates to the field of semiconductor electronic devices and more specifically to semiconductor integrated circuit devices in which an improved method for depositing protective layers of silicon oxynitride is used to provide increased manufacturability by improving yield and reliability for such devices.

(2) Description of the Prior Art

The manufacture of semiconductor integrated circuit devices is achieved by the use of a variety of thin films of materials which are deposited and shaped to perform each of the specialized functions required for the effective performance of such devices. A semiconductor substrate is used for the fabrication of electrical elements and components which are then interconnected electrically to form the desired circuit and function. Due to the need for constantly increased performance, the dimensions of the components and their separation have become smaller to minimize the separation and hence the time delay for propagation of electrical signals in the circuit. This has resulted not only in smaller device dimensions but also in reduced dimensions of all other aspects of device fabrication. Thus, the thicknesses of the thin films of conductive materials and the insulating and protective layers employed in the devices have decreased in proportion. The decreasing thicknesses of interconnection patterns of aluminum, as an example of a widely used conductive material, results in an increased susceptibility to corrosion by such substances as moisture, which can lead to an increase in electrical resistance or even open circuits. Likewise, the decreased thicknesses of protective layers of material deposited over components and elements such as aluminum may give rise to a diminished ability to afford a protective barrier against moisture.

Agents such as moisture or certain gaseous ambients can also give rise to changes in the surface electrical properties of the semiconductor substrate and its various elements. In addition to permitting greater degrees of permeation by chemical species, the reduced thickness of insulating and passivating films and layers also leads to a greater degree of transmission of electrically charged species such as energetic or "hot" electrons from one device region to another where such charge may be trapped, interfering with the electrical operation of the device. To minimize this phenomenon, thin insulating layers with superior dielectric properties are increasingly required.

For the reasons mentioned, thin films of barrier materials have been devised to act as blocking or hindering agents to deleterious species when deposited over the various elements of semiconductor integrated circuit devices. Originally, layers of silicon nitride, $Si_3N_4$, were found to be superior to silicon oxide for reducing the transmission of deleterious species such as sodium and potassium ions, and the higher value of the relative dielectric constant was desirable for electrical purposes. More recently, an even more effective material for this purpose is the compound formed among the elements silicon, nitrogen, and oxygen which is generically referred to as silicon oxynitride and is written as $SiO_xN_y$ where x and y refer to the variable amounts of oxygen and nitrogen respectively depending on the details of the method of deposition. This type of material in the form of a thin film can function to minimize the sensitivity of the semiconductor surface electrical potential to various ambients during the processes of device fabrication and later in operation. It also serves as a barrier to diffusion of moisture and such unwanted ionic species as sodium and potassium ions. As a very thin film, it is more effective in minimizing the passage and trapping of hot electrons.

Silicon oxynitride layers have been deposited from various combinations of gases such as silane $SiH_4$, silane derivatives Rsi, or organosiloxanes ROSi to supply the silicon atoms and oxygen- and nitrogen-containing gases to supply these atomic species in the desired proportions in layers deposited by the process of chemical vapor deposition. A particularly useful gas is nitrous oxide $N_2O$ which contains both. Other possibilities are combinations of gases such as ammonia $NH_3$, oxygen $O_2$, etc. The use of an electrical plasma sustained in the reacting gases to enhance the deposition rate or improve the properties of the deposited film or both has been discussed in the literature. For example, the use of the combination of tetraethoxysilane (TEOS)+$N_2$+$NH_3$ plasma-enhanced CVD processes to produce films of silicon oxynitride is discussed by Harada in U.S. Pat. No. 5,362,686. The use of nitrous oxide is not discussed and the method of plasma generation and sustenance is not described in any detail. Other descriptions of the use of silicon oxynitride deposited layers for various purposes in electrical device fabrication by (U.S. Pat. No. 4,381,595) and (U.S. Pat. No. 5,071,790) mention electrical interconnections on a semiconductor substrate, but neither the use of nitrous oxide nor the details of the plasma process are discussed.

SUMMARY OF THE INVENTION

It is a principal object of the invention to describe a method for producing a barrier layer of silicon oxynitride deposited on a semiconductor integrated circuit device to act protectively with respect to penetration by moisture or other deleterious species to protect the semiconductor surface and the interconnections of the device.

It is another object of the invention to describe a process for producing optimized properties of silicon oxynitride layers by plasma-enhanced chemical vapor deposition from nitrous oxide and a silicon-containing gas.

These objects are achieved by a process of plasma-enhanced chemical vapor deposition of silicon oxynitride from a gas mixture of nitrous oxide and a silicon-containing gas employing a dual-power source of plasma generation and sustenance to produce optimum properties of the deposited layer, for passivation of the semiconductor surface, minimization of trapping energetic electrons, and protection of the elements of the device from moisture and other potentially deleterious ambients.

BRIEF DESCRIPTION OF THE DRAWINGS

FIG. 1 is a schematic cross-sectional diagram of a portion of a semiconductor integrated circuit device of the prior art.

FIG. 2 is a schematic cross-sectional diagram of a portion of a semiconductor device of the current invention.

DESCRIPTION OF THE PREFERRED EMBODIMENT

Figure 3:
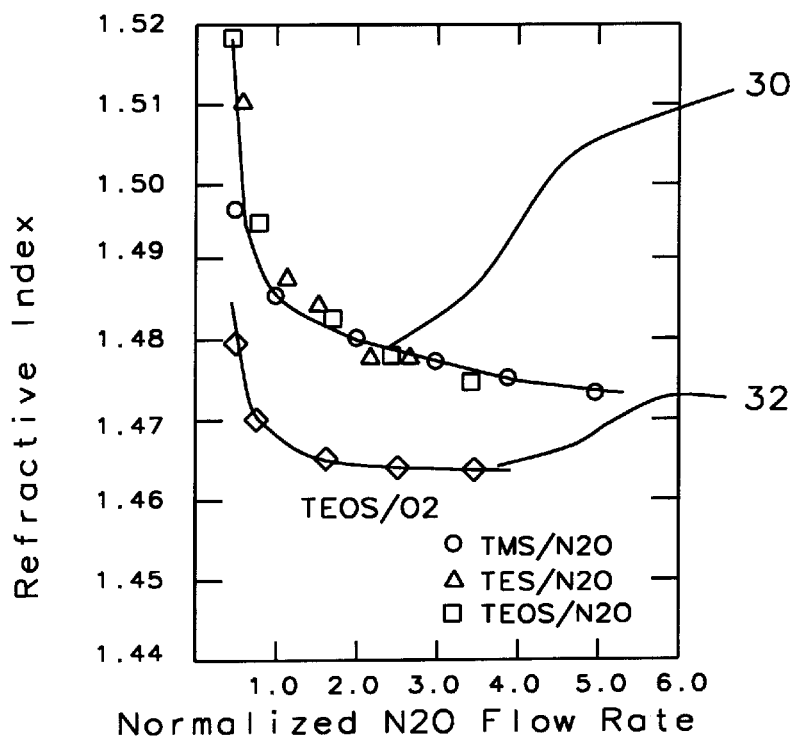
FIG. 3 is a graph of the properties of silicon oxynitride layers deposited by variations of the process of the current invention.

Referring now more particularly to FIG. 1, there is shown a schematic cross-section of a portion of a semiconductor integrated circuit device fabricated according to the prior art. There is shown a semiconductor substrate 10 containing electrically active elements coated with an insulating oxide layer 12. Interconnecting the semiconductor circuit elements is a layer of conductor material 14 formed into an appropriate pattern. A barrier or "liner" layer 16 is deposited over the previous layers, and a final layer of chemically vapor-deposited silicon oxide 18 is placed over the barrier layer. One function of the barrier layer is to protect the underlying device structures during the deposition of the final oxide layer, which is typically done by a CVD process employing ozone $O_3$ and tetraethoxysilane TEOS.

Referring now more particularly to FIG. 2, there is shown a schematic cross-section of a portion of a semiconductor integrated circuit device of the current invention. A semiconductor substrate 20 containing circuit elements is coated with a silicon oxide layer 22 and an interconnection pattern 24. Over these is deposited a barrier or "liner" layer of silicon oxynitride 26 deposited from a reactive gas mixture consisting of nitrous oxide $N_2O$ and a silane derivative RSi by a plasma-assisted CVD process using a dual power supply to energize and sustain the plasma. Finally, the device structure is covered with a silicon oxide layer 28 deposited by a CVD process from a gas mixture of $O_3$ and TEOS.

The use of a dual power supply to energize and sustain the plasma during the deposition of silicon oxynitride is beneficial in that the plasma is driven by radio frequency power at a frequency of 13.56 mHz while a separate low-frequency bias power supply at between 300 and 380 kHz permits the bombardment of the depositing film by ions from the plasma, resulting in improved film properties. The use of $N_2O$ and silane derivatives (see line 30 in FIG. 3) as reactive gases is an improvement over the use of TEOS and $O_2$ (see line 32) as is shown by FIG. 3. The higher value for the refractive indices of deposited films from $N_2O$ is a measure of improved electrical properties since refractive index and dielectric constant are directly proportional.

Figure 4:
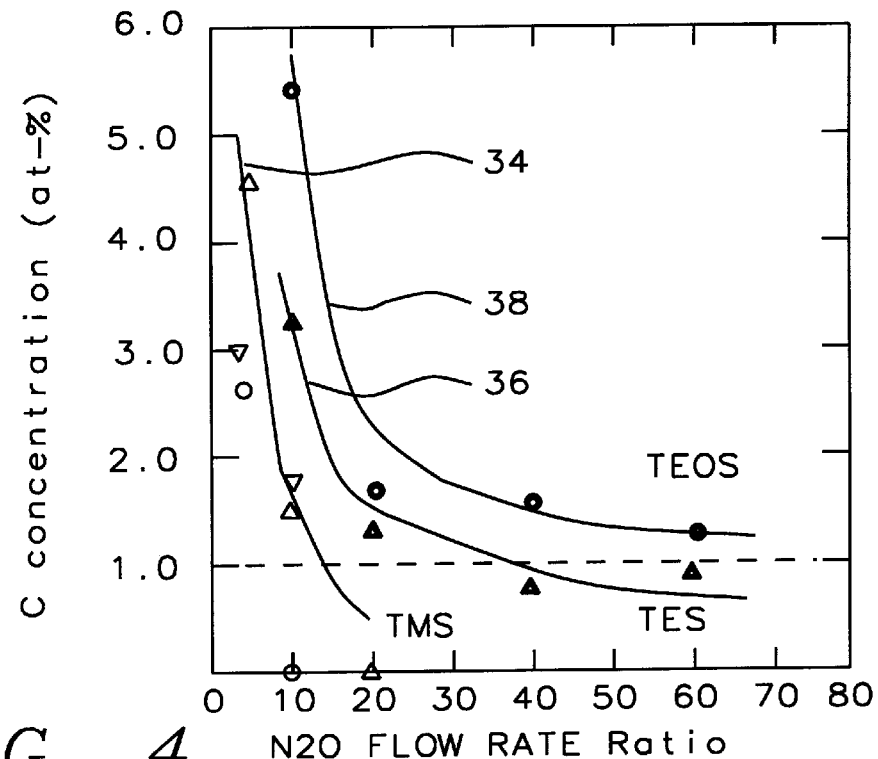
FIG. 4 is a graph of the improved properties of silicon oxynitride layers deposited in accordance with the current invention.

The flow rate of $N_2O$ during CVD of the barrier layer should be kept in a ratio of 20 or more times that of the silane derivative employed to obtain reproducible and desirable film properties. This is shown in FIG. 4, in which the amount of residual carbon found in the deposited oxynitride film is given for various combinations of $N_2O$ and silane derivatives at various flow rate ratios. It is seen that ratios of 20 or more, and a carbon concentration of less than about 1% on the interconnection pattern and the elements and the devices, are preferred, and that derivatives such as tetramethylsilane (TMS) 34 and tetraethylsilane (TES) 36 are preferred to oxysilane derivatives such as TEOS 38. The process parameters for optimum properties of the silicon oxynitride layer are given in Table I:

TABLE I

| RF Power (watts) | Bias Power (watts) | $N_2O$ Flow Rate (sccm) | TEOS Flow Rate (sccm) | TEOS Pressure (torr) | Substrate Temp. (° C.) |
|---|---|---|---|---|---|
| 400–1200 | 100–300 | >600 | 30–150 | 2–10 | 300–420 |

While the invention has been particularly shown and described with reference to the preferred embodiments thereof it will be understood by those skilled in the art that various changes in form and details may be made without departing from the spirit and scope of the invention.

What is claimed is:

1. A method for the passivation and protection of a semiconductor integrated circuit device comprising the steps of:

forming a silicon oxide layer on a semiconductor substrate containing elements and devices;

forming a conductive pattern interconnecting said elements and said devices and said semiconductor substrate;

depositing a barrier layer of silicon oxynitride on said interconnection pattern and said elements and said devices by means of a plasma-enhanced chemical vapor deposition process further comprising:

forming a gas mixture of nitrous oxide and a silicon-containing gas with a flow rate of nitrous oxide greater then 600 standard cubic centimeters per minute and a nitrous oxide:silicon-containing gas flow rate ratio of greater than 20:1, and;

sustaining an electrical plasma in the said gas mixture employing dual power sources to deposit said layer of silicon oxynitride;

depositing a final protective silicon oxide layer over said silicon oxynitride barrier layer.

2. The method of claim 1 wherein said depositing a barrier layer comprises the steps of:

controlling the pressure of said nitrous oxide and silicon-containing gases; and controlling the temperature of said semiconductor substrate during the deposition of said silicon oxynitride layer.

3. The method of claim 1 wherein said silicon-containing gases are selected from the group consisting of silane, tetramethylsilane, tetraethylsilane, and tetraethoxysilane.

4. The method of claim 1 wherein said dual power sources comprises:

a low-frequency bias power of between about 300 and 380 kilohertz at a power of between about 100 and 300 watts; and a radio frequency power input at 13.56 megahertz at a power of between about 400 and 1200 watts.

5. A method for the passivation and protection of a semiconductor integrated circuit device comprising the steps of:

forming a silicon oxide layer on a semiconductor substrate containing elements and devices;

forming a conductive pattern interconnecting said elements and said devices and said semiconductor substrate;

depositing a barrier layer of silicon oxynitride having a carbon concentration of less than about 1% on said interconnection pattern and said elements and said devices by means of a plasma-enhanced chemical vapor deposition process further comprising:

controlling the temperature of said semiconductor substrate between about 300 and 420° C.;

forming a gas mixture of nitrous oxide and a silicon-containing gas with a flow rate of nitrous oxide greater than 600 sccm and a nitrous oxide:silicon-containing gas flow rate ratio of greater than 20:1; and sustaining an electrical plasma in the said mixture employing dual power sources to deposit said layer of silicon oxynitride; said dual power sources comprising a low-frequency bias power of between about 300 and 380 kHz at a power of between about 100 and 300 watts, and a radio frequency power input at 13.56 MHz at a power of between about 400 and 1200 watts; and depositing a final protective silicon oxide layer over said silicon oxynitride barrier layer.

6. The method of claim 5, wherein said depositing a barrier layer further includes the step of:

controlling the pressure of said nitrous oxide and silicon-containing gases.

7. The method of claim 5, wherein said silicon-containing gases are selected from the group consisting of silane, tetramethylsilane, tetraethylsilane, and tetraethoxysilane.

* * * * *